United States Patent
Park et al.

(10) Patent No.: US 8,623,714 B2
(45) Date of Patent: Jan. 7, 2014

(54) SPACER PROTECTION AND ELECTRICAL CONNECTION FOR ARRAY DEVICE

(75) Inventors: Jae-Eun Park, Hopewell Junction, NY (US); Weipeng Li, Hopewell Junction, NY (US); Deleep R. Nair, Hopewell Junction, NY (US); M. Dean Sciacca, Hopewell Junction, NY (US); Voon-Yew Thean, Hopewell Junction, NY (US); Ava Wan, Hopewell Junction, NY (US); Dong-Hun Lee, Hopewell Junction, NY (US); Yong-Meng Lee, Hopewell Junction, NY (US)

(73) Assignees: International Business Machines Corporation, Armonk, NY (US); Chartered Semiconductor Manufacturing, Ltd., Singapore (SG); Samsung Electronics Co., Ltd. (KR)

( * ) Notice: Subject to any disclaimer, the term of this patent is extended or adjusted under 35 U.S.C. 154(b) by 765 days.

(21) Appl. No.: 12/728,488

(22) Filed: Mar. 22, 2010

(65) Prior Publication Data
US 2011/0227136 A1 Sep. 22, 2011

(51) Int. Cl.
*H01L 21/00* (2006.01)
(52) U.S. Cl.
USPC .............................. 438/151; 438/197; 438/597
(58) Field of Classification Search
None
See application file for complete search history.

(56) References Cited

U.S. PATENT DOCUMENTS

| | | | | |
|---|---|---|---|---|
| 8,129,234 B2* | 3/2012 | Wallner et al. | ................ | 438/204 |
| 8,242,542 B2* | 8/2012 | He et al. | ......................... | 257/213 |
| 2003/0157774 A1* | 8/2003 | Tominari et al. | ............. | 438/312 |
| 2009/0081836 A1* | 3/2009 | Liu et al. | ........................ | 438/229 |
| 2010/0213547 A1* | 8/2010 | He et al. | ........................... | 257/347 |
| 2011/0057266 A1* | 3/2011 | Wallner et al. | ................. | 257/378 |
| 2011/0175152 A1* | 7/2011 | Booth et al. | ................... | 257/306 |
| 2011/0221003 A1* | 9/2011 | Doris et al. | .................... | 257/368 |
| 2011/0227136 A1* | 9/2011 | Park et al. | ...................... | 257/288 |

OTHER PUBLICATIONS

H. Hayashida, et al., "Manufacture Local Interconnect Technology Fully Compatible with Titanium Salicide Process" Eighth International IEEE VLSI Mulitlevel Interconnection Conf. Jun. 11, 12, 1991, p. 332.
T. Tang et al., "Titanium Nitride Local Interconnect Technology fo VLSI", IEEE Transactions on Electron Devices, vol. ED 34, No. 3, Mar. 1987.

* cited by examiner

*Primary Examiner* — David E Graybill
(74) *Attorney, Agent, or Firm* — Scully, Scott, Murphy & Presser, P.C.; Yuanmin Cai (57) ABSTRACT

The present disclosure provides a method of forming an electrical device. The method may begin with forming a gate structure on a substrate, in which a spacer is present in direct contact with a sidewall of the gate structure. A source region and a drain region is formed in the substrate. A metal semiconductor alloy is formed on the gate structure, an outer sidewall of the spacer and one of the source region and the drain region. An interlevel dielectric layer is formed over the metal semiconductor alloy. A via is formed through the interlevel dielectric stopping on the metal semiconductor alloy. An interconnect is formed to the metal semiconductor alloy in the via. The present disclosure also includes the structure produced by the method described above.

15 Claims, 4 Drawing Sheets

SPACER PROTECTION AND ELECTRICAL CONNECTION FOR ARRAY DEVICE

BACKGROUND

The present disclosure relates to memory and semiconductor devices and interconnect structures to memory and semiconductor devices. More particularly, the present disclosure relates to scaling of memory and semiconductor devices.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges.

SUMMARY

The present disclosure provides a method for forming electrical devices, such as semiconductor devices, and forming interconnect structures to electrical devices. In one embodiment, the method provides a metal semiconductor alloy that protects the spacers that are adjacent to the gate conductor of a gate structure during etching of an interlevel dielectric in forming the via of an interconnect to the electrical device. The method may begin with forming a gate structure on a substrate, in which a spacer is present in direct contact with a sidewall of the gate structure. A source region and a drain region are formed in the substrate. A metal semiconductor alloy is formed on an upper surface of the gate structure, an outer sidewall of the spacer and an upper surface of one of the source region and the drain region. An interlevel dielectric layer is formed over the metal semiconductor alloy. A via is formed through the interlevel dielectric stopping on the metal semiconductor alloy. An interconnect is formed to the metal semiconductor alloy in the via.

In another embodiment, the method of forming the electrical device includes forming a gate structure on a substrate, wherein the gate structure includes a spacer on a sidewall of at least a gate conductor of the gate structure. A source region and a drain regions are formed in the substrate. A metal containing layer is formed on at least an upper surface of the gate conductor of the gate structure, the spacer, and an upper surface of one of the source region and the drain region. A dielectric layer is formed over a first portion of the metal containing layer, wherein a second portion of the metal containing layer extending from at least a portion of the upper surface of the gate conductor to at least a portion of the one of the source region and the drain region is exposed. A semiconductor containing layer is formed on the second portion of the metal layer and the dielectric layer. The semiconductor containing layer and the second portion of the metal is alloyed to provide a metal semiconductor alloy that extends from at least the portion of the upper surface of the gate conductor to at least the portion of one of the source region and the drain region. The metal semiconductor alloy extends over an outer sidewall of the spacer. An interlevel dielectric is formed having an interconnect present in a via to at least a portion of the metal semiconductor alloy.

In another aspect, a semiconductor device is provided that includes a gate structure present on a first portion of a substrate. The gate structure includes at least a gate conductor and a spacer that is present in direct contact with a sidewall of the gate conductor. Source and drain regions are present in a second portion of the substrate that is laterally adjacent to the first portion of the substrate. A metal semiconductor alloy is present on an upper surface of the gate conductor, present on an outer sidewall surface of the spacer, and present on an upper surface of one of the source and drain region. An interlevel dielectric having an interconnect in electrical communication to the metal semiconductor alloy.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present disclosure relate to methods and structures for producing electrical devices, such as semiconductor devices. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. Some examples of semiconductor devices include but are not limited to field effect transistors, such as metal oxide semiconductor field effect transistors (MOSFETs) and complementary metal oxide semiconductor (CMOS) devices; bipolar junction transistors and memory devices, such as flash, DRAM, and eDRAM devices. As used herein a "field effect transistor" is a transistor in which output current, i.e., source-drain current, is controlled by the voltage applied to the gate. A field effect transistor (FET) has three terminals, i.e., gate, source and drain. As used herein, the term "memory device" means a structure in which the electrical state can be altered and then retained in the altered state, in this way a bit of information can be stored. As noted above, any suitable electrical device having an interconnect may utilize the present invention including capacitors, diodes and resistors.

In some embodiments, a single interconnect provides electrical communication to the gate conductor of a semiconductor device's gate structure, and one, but not both, of the source region and the drain region of the semiconductor device. The gate structure typically includes at least one gate conductor and at least one spacer abutting the at least one gate conductor. In one embodiment, a metal semiconductor alloy provides a contact pad for the interconnect, and is formed on an upper surface of the gate structure, an outer sidewall of the spacer and an upper surface of one of the source region and the drain region. The metal semiconductor alloy may also function as an etch stop during the formation of the via that contains the interconnect. In some embodiments, by utilizing the metal semiconductor alloy as an etch stop, the present method may ensure that the underlying spacer is not damaged by the etch. Because, the spacer is present over a portion of the channel region, and the metal semiconductor alloy ensures that the integrity of the spacer is not compromised by the etch process that produces the via for the interconnect, the present method may eliminate the possibility that the interconnect to one of the source and the drain region does not contact the channel region of the memory device. When describing the inventive method and structures, the following terms have the following meanings, unless otherwise indicated.

The term "metal semiconductor alloy" means a solid solution, i.e., mixture, of at least one metal and at least one semiconductor from the Periodic Table of Elements.

A "silicide" is an alloy of a metal element and silicon.

"Electrically conductive" as used throughout the present disclosure means a material typically having a room temperature conductivity of greater than $10^{-8} \, (\Omega\text{-m})^{-1}$.

As used herein, the term "electrical communication" means that a first structure or material can conduct electricity, i.e., is electrically conductive, to a second structure or material.

The term "direct contact" or "directly on" means that a first element, such as a first structure, and a second element, such as a second structure, are connected without any intermediary conducting, insulating or semiconductor layers at the interface of the two elements.

The terms "over", "overlying", "atop", "under", "underlying", "positioned on" or "positioned atop" means that a first element, such as a first structure, is present on a second element, such as a second structure, wherein intervening elements, such as an interface structure, e.g. interface layer, may be present between the first element and the second element.

FIGS. 1-8 depict one embodiment of a method of forming a semiconductor device 100, e.g., memory device, in which a metal semiconductor alloy 50 protects the spacers 14 that are adjacent to the gate conductor 2 of a gate structure 20 during etching of the interlevel dielectric 60 in forming the via 65a, 65b of an interconnect 70 to the semiconductor device 100. In one example, the semiconductor device 100 is a static random access memory device (SRAM). Static Random Access Memory (SRAM) is a type of semiconductor memory, in which the word static indicates that, unlike dynamic RAM (DRAM), it does not need to be periodically refreshed, as SRAM uses bistable latching circuitry to store each bit. SRAM exhibits data remanence, but is still volatile in the conventional sense that data is eventually lost when the memory is not powered.

Each bit in an SRAM is stored on four transistors, such as field effect transistors, that form two cross-coupled inverters. This storage cell has two stable states, which are used to denote 0 and 1. Two additional access transistors serve to control the access to a storage cell during read and write operations. A typical SRAM uses six MOSFETs to store each memory bit. In addition to such 6T SRAM, other kinds of SRAM chips use 8T, 10T, or more transistors per bit. This is sometimes used to implement more than one (read and/or write) port, which may be useful in certain types of video memory and register files implemented with multi ported SRAM circuitry. For the purposes of simplicity, the following description and figures describe a single transistor, but the method disclosed herein is applicable to any number of transistors in an SRAM memory device configuration. In addition to SRAM devices, the present method is suitable for forming any semiconductor device that includes transistors, such as field effect transistors.

Figure 1:
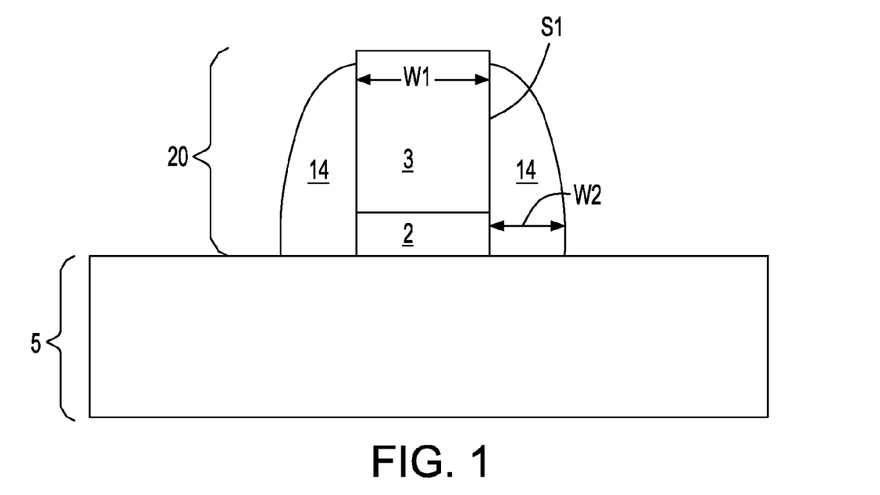
FIG. 1 is a side cross-sectional view depicting forming a gate structure on a substrate, wherein the gate structure includes a spacer on a sidewall of at least a gate conductor of the gate structure, in accordance with one embodiment of the present method of forming an electrical device.

FIG. 1 depicts one embodiment of forming a gate structure 20 on a substrate 5, wherein the gate structure 20 includes a spacer 14 on a sidewall of at least a gate conductor 3 of the gate structure 20. The gate structure 20 may be formed atop a substrate 5 utilizing deposition, lithography and etch processes. The term "gate structure" means a structure used to control output current (i.e., flow of carriers in the channel) of a semiconducting device, e.g., memory device, through electrical or magnetic fields. In one embodiment, the gate structure 20 includes at least one gate conductor 3 positioned atop at least one gate dielectric 2. The substrate 5 includes, but is not limited, to any semiconducting material including Si-containing materials, GaAs, InAs and other like semiconductors. Si-containing materials include, but are not limited to Si, bulk Si, single crystal Si, polycrystalline Si, SiGe, amorphous Si, silicon-on-insulator substrates (SOI), SiGe-on-insulator (SGOI), annealed poly Si, and poly Si line structures. Layered semiconductors such as Si/Ge are also contemplated herein. Isolation regions (not shown) may be formed in the substrate 5. The isolation region may comprise any dielectric material, such as oxide, nitride, oxynitride or a combination thereof.

In one example, the at least one gate dielectric 2 that is formed atop the substrate 5 is an oxide material, which may be greater than 0.8 nm thick. The at least one gate dielectric 2 may also be composed of a nitride, oxynitride, or combination thereof. In one embodiment, the at least one gate dielectric 2 ranges from 1.0 nm to 1.2 nm thick. The at least one gate dielectric 2 may be formed using deposition techniques, such as, for example, chemical vapor deposition (CVD), atomic layer CVD (ALCVD), pulsed CVD, plasma assisted CVD, sputtering, and chemical solution deposition. In another embodiment, the at least one gate dielectric 2 is formed by a thermal growing process, which may include oxidation, oxynitridation, nitridation, and/or plasma or radical treatment. In yet another embodiment, the at least one gate dielectrics can be formed utilizing a combination of deposition and thermal growth. Suitable examples of oxides that can be employed for the at least one the gate dielectric 2 include, but are not limited to: $SiO_2$, $Al_2O_3$, $ZrO_2$, $HfO_2$, $Ta_2O_5$, $TiO_2$, perovskite-type oxides and combinations and multi-layers thereof. The at least one gate dielectric 2 can be in either amorphous, polycrystalline, or epitaxial form.

The at least one gate conductor 3 can be comprised of a semiconductor, such as polysilicon; a metal; a metal semiconductor alloy or combinations and multilayers thereof. The at least one gate conductor 3 can be formed atop the at least one gate dielectric 2 utilizing a deposition process, such as chemical vapor deposition (CVD), physical vapor deposition (PVD), e.g., sputtering or plating, or a combination thereof.

The gate structure 20 can be formed from the deposited layers of the at least one gate dielectric 2 and the at least one gate conductor 3 utilizing a patterning technique, for example, photolithography and etching. In some examples, the gate structure 20 may be formed using replacement gate processing. Specifically, and in one embodiment, a pattern is produced by applying a photoresist to the surface to be patterned, exposing the photoresist to a pattern of radiation, and then developing the pattern into the photoresist utilizing a conventional resist developer. Once the patterning of the photoresist is completed, the sections covered by the photoresist are protected, while the exposed regions are removed using a selective etching process that removes the unprotected regions.

Although the figures of the present disclosure only depict a single gate structure 20, embodiments have been contemplated in which the semiconductor device 100 includes multiple gate structures 20 separated by a pitch. In one embodiment, the pitch may be measured from the center of the upper surface of the gate conductor 3 of a first gate structure to the center of the upper surface of the gate conductor 3 of an adjacent gate structure.

The actual dimensions for the pitch may depend upon the technology node. In one example, the pitch is less than 500 nm. In another example, the pitch ranges from 20 nm to 450 nm. In yet another example, the pitch ranges from 40 nm to 300 nm. In yet an even further example, the pitch ranges from 80 nm to 150 nm.

The gate structure 20 may include at least one spacer 14. The at least one spacer 14 may be formed in direct contact with the sidewall S1 of the gate conductor 3 and the sidewall of the gate dielectric 2 using deposition and etch processes. In one embodiment, an oxide surface layer may be present on the sidewall of the gate conductor 3, which is present between the gate conductor 3 and the at least one spacer 14. In one embodiment, the at least one spacer 14 has a width W2 measured at the base of the spacer 14 ranging from 3 nm to 40 nm. In another embodiment, the at least one spacer 14 has a width W2 measured at the base of the at least one spacer 14 ranging from 5.0 nm to 20.0 nm. In an even further embodiment, the at least one spacer 14 has a width W2 measured at the base of the spacer 14 ranging from 7.0 nm to 15.0 nm. The at least one spacer's 14 width W2 may taper, i.e., may reduce, in the direction from the substrate 5 towards the upper surface of the gate conductor 3.

The at least one spacer 14 may be comprised of a dielectric material, such as a nitride, e.g., silicon nitride. In one embodiment, the at least one spacer 14 may be comprised of a low-k dielectric material. The at least one spacer 14 comprised of low-k dielectric material typically has a dielectric constant that is less than 4.0, e.g., 3.9. In one embodiment, the at least one spacer 14 comprised of low-k dielectric materials has a dielectric constant ranging from 1.75 to 3.5. In another embodiment, the at least one spacer 14 comprised of low-k dielectric materials has a dielectric constant ranging from 2.0 to 3.2. In yet an even further embodiment, the at least one spacer 14 comprised of low-k dielectric materials has a dielectric constant ranging from 2.25 to 3.0. Examples of materials suitable for the at least one spacer 14 that is comprised of low-k dielectric materials include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

Figure 2:
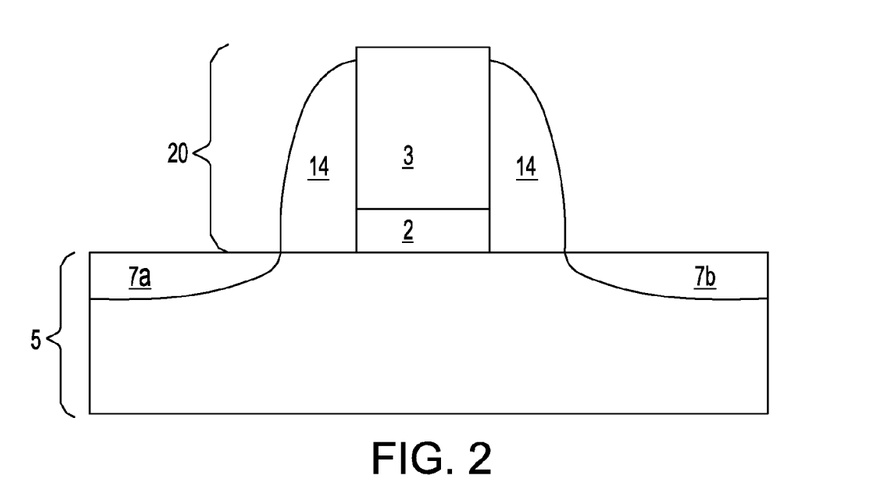
FIG. 2 is a side cross-sectional view depicting forming a source region and a drain region in a substrate, in accordance with one embodiment of the present method of forming an electrical device.

Referring to FIG. 2, source and drain regions 7a, 7b are formed in the substrate 5. "Drain" means a doped region in the semiconductor device, e.g., memory device, located at the end of the channel, in which carriers are flowing out of the transistor through the drain. As used herein, the term "source" is a doped region in the semiconductor device, in which majority carriers are flowing into the channel. Although FIG. 2 depicts a single dopant region, i.e., implant region, for each of the source region 7a and the drain region 7b, embodiments have been contemplated in which the source region 7a and the drain region 7b include shallow source regions and shallow drain regions. The source and drain regions 7a, 7b may also include halo dopant regions.

The shallow source region and the shallow drain region (not shown) are formed via ion implantation and comprise a combination of normally incident and angled implants to form the desired grading in the shallow dopant regions. For producing n-type field effect transistor (NFET) devices group V elements from the Periodic Table of Elements are implanted into the substrate 5 that is composed of a group IV element of the Periodic Table of Elements. Implant energies for forming shallow source regions and shallow drain regions comprised of arsenic typically range from 1 keV to 5 keV. Implant energies for forming shallow source regions and shallow drain regions comprised of $BF_2$ typically range from 1 keV to 7 keV. Implant energies for forming shallow source regions and shallow drain regions comprised of boron range from 1 keV to 2 keV. These implants are typically carried out using a low concentration of dopant dose ranging from $4 \times 10^{14}$ atoms/cm$^2$ to $2 \times 10^{15}$ atoms/cm$^2$.

A high energy ion implant is conducted to form deep source regions and deep drain regions. These implants are typically carried out using a high concentration of dopant dose ranging from $1 \times 10^{15}$ atoms/cm$^2$ to $5 \times 10^{15}$ atoms/cm$^2$. In one embodiment, the dopant dose for the deep source region and the deep drain region is $3 \times 10^{15}$ atoms/cm$^2$. In some embodiments, the implant energy is dependent on implant species and the substrate 5. For example, an arsenic implant for deep source regions and deep drain regions into a silicon-containing substrate 5 typically requires an implant ranging from 10 keV to 20 keV. It is noted that any Group III or Group V element from the Periodic Table of Elements is suitable for the deep source region and the deep drain region of the semiconductor device, in which the implant species is typically dependent upon whether the semiconductor device, e.g., memory device, is an n-type semiconductor device or a p-type semiconductor device. P-type refers to the addition of impurities to an intrinsic semiconductor that creates deficiencies of valence electrons. In a silicon-containing substrate, examples of n-type dopants, i.e., impurities, include but are not limited to boron, aluminum, gallium and indium. N-type refers to the addition of impurities that contributes free electrons to an intrinsic semiconductor. In a silicon-containing substrate examples of n-type dopants, i.e., impurities, include but are not limited to antimony, arsenic and phosphorous.

Following the formation of the shallow source region and shallow drain region, or deep source region and the deep drain regions when present, the dopants that are present in the source region 7a and the drain region 7b are activated by activation annealing. Activation annealing may include at least one of rapid thermal annealing, furnace annealing, flash annealing, laser annealing, or any suitable combination of those annealing techniques. In one embodiment, the activation anneal is conducted at a temperature above 850° C. In another embodiment, the activation anneal is conducted at a temperature greater than 1000° C. This step of the present invention activates the dopant atoms, which changes the conductivity of the Si-containing material to which the dopants were implanted. Although not depicted in the Figures, raised source regions and raised drain regions have been contemplated and are within the scope of the present disclosure. Raised source regions and raised drain regions typically include a doped epitaxially grown semiconductor material that is adjacent to the gate structure 20.

The gate structure 20 and the at least one spacer 14 are formed on the portion of the substrate 5 in which the channel of the semiconductor device (semiconductor devices of the memory device) is present. As used herein, the term "channel" is the region between the source and drain of the semiconductor device, e.g., memory device, that becomes conductive when the semiconductor device is turned on. Because the channel is present underlying the at least one spacer 14, the spacer 14 protects the channel from being contacted by the subsequently formed interconnects that are in electrical communication with the source region 7a and the drain region 7b.

Figure 3:
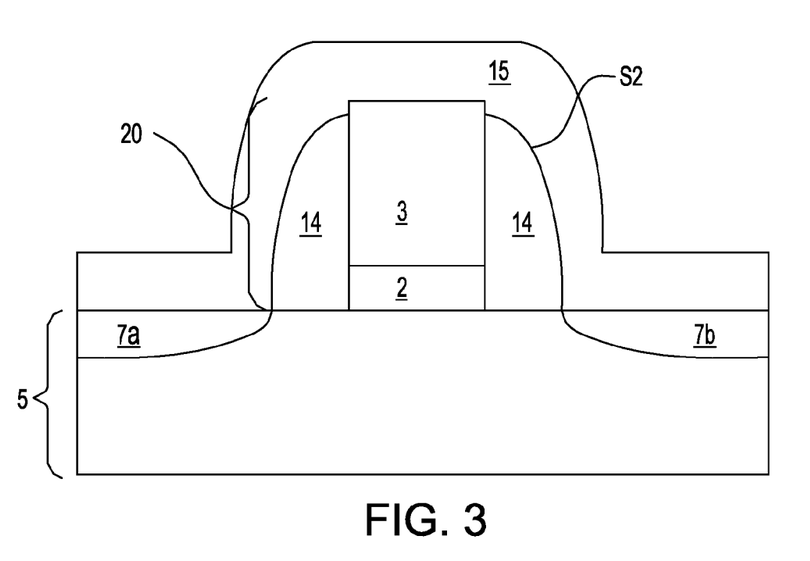
FIG. 3 is a side cross-sectional view depicting forming a metal containing layer on at least an upper surface of the gate conductor of the gate structure, the spacer, and an upper surface of the source region and the drain region, in accordance with one embodiment of the present method of forming an electrical device.

FIG. 3 depicts one embodiment of forming a metal containing layer 15 on at least an upper surface of the gate conductor 3 of the gate structure 20, the outersidewall surface S2 of the at least one spacer 14, and an upper surface of the source region 7a and the drain region 7b. The metal containing layer 15 may be blanket deposited on the upper surface of the structure shown in FIG. 2 utilizing a deposition process. In one embodiment, the deposition process produces a conformal layer. The term "conformal" denotes a layer having a thickness that does not deviate from greater than or less than 30% of an average value for the thickness of the layer.

Examples of deposition processes that can be used in forming the metal containing layer 15 include, but are not limited to chemical vapor deposition (CVD), physical vapor deposition (PVD), atomic layer deposition (ALD), sputtering or evaporation. For example, the metal containing layer 15 may include an elemental metal, a metal nitride, a metal silicon nitride or a combination thereof. Although, the metal containing layer 15 is depicted as a single layer, multi-layer structures have also been contemplated and are within the scope of the present disclosure.

In one embodiment, the metal containing layer 15 is composed of a metal from the Periodic Table of Elements. Hence, the metal containing layer 15 may include, but is not limited to Al, Pt, Au, Ag, Cu, Ta, Ti, W, Pt, Co, Ni, Zr, Hf, V, Nb or Ta or alloys thereof. In one example, the metal containing layer 15 comprises a metal nitride, such as TiN or TaN. The physical thickness of the metal containing layer 15 may vary, but in one embodiment, the metal containing layer 15 has a thickness ranging from 0.5 nm to 200 nm. In another embodiment, the metal containing layer 15 has a thickness ranging from 5 nm to 80 nm.

In one embodiment, the metal containing layer 15 is TiN that is deposited by evaporating Ti from an effusion cell held in the range of 1550° C. to 1900° C., and using an atomic/excited beam of nitrogen that is passed through a remote radio frequency source. The substrate temperature can be around 300° C., and the nitrogen flow rate can be between 0.5 sccm and 3.0 sccm. These ranges are exemplary and by no way limit the present invention. The TiN may be deposited, in other ways, as well, such as chemical vapor deposition or sputtering.

Figure 4:
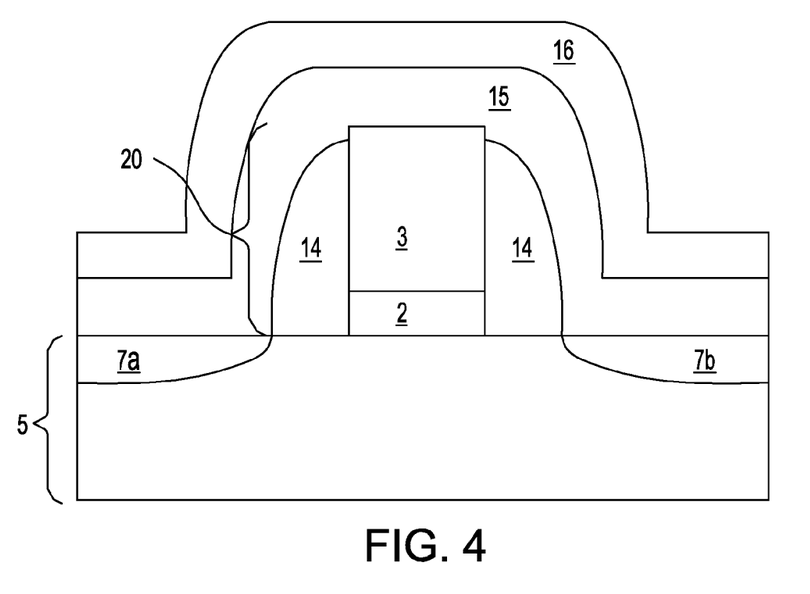
FIG. 4 is side cross-sectional view depicting forming a dielectric layer over the metal containing layer, in accordance with one embodiment of the present method of forming an electrical device.

FIG. 4 depicts forming a dielectric layer 16 over the metal containing layer 15. The dielectric layer 16 may be a nitride, an oxide, or oxynitride material. Some examples of materials for the dielectric layer 16 include, but are not limited to $SiO_2$, $Si_3N_4$, SiON, boron phosphate silicate glass, $Al_2O_3$, $HfO_2$, $ZrO_2$, HfSiO, or any combination thereof including multi-layered structures. Typically, the dielectric layer 16 may have a thickness ranging from 10 nm to 500 nm. In another embodiment, the dielectric layer 16 has a thickness ranging from 50 nm to 450 nm.

The dielectric layer 16 may also be formed by a thermal growing process, which may include oxidation, oxynitridation, nitridation, and/or plasma or radical treatment. In one embodiment, in which the dielectric layer 16 is composed of an oxide, the dielectric layer may be formed using thermal oxidation. In one embodiment, in which the dielectric layer 16 is comprised of a nitride, the dielectric layer may be formed using nitridation.

The dielectric layer 16 may also be deposited by chemical vapor deposition (CVD). In one embodiment, the deposition process produces a conformal layer. Variations of CVD processes suitable for depositing the dielectric layer 16 include, but are not limited to Atmospheric Pressure CVD (APCVD), Low Pressure CVD (LPCVD) and Plasma Enhanced CVD (EPCVDPECVD), Metal-Organic CVD (MOCVD) and combinations thereof.

Figure 5:
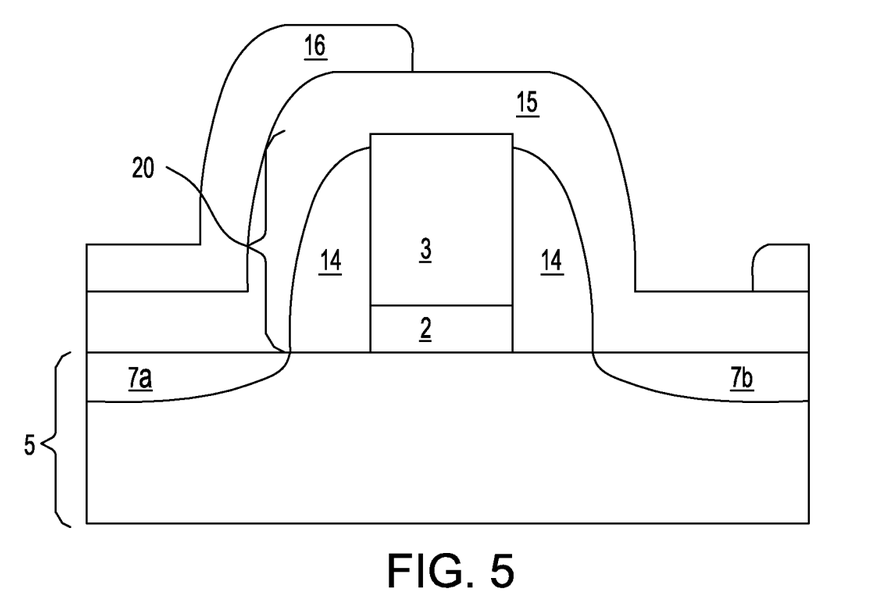
FIG. 5 is side cross-sectional view depicting etching the dielectric layer, in which a first portion of the dielectric layer remains atop the metal containing layer and a second portion of the dielectric layer is removed to expose the underlying metal containing layer, in accordance with one embodiment of the present method of forming an electrical device.

FIG. 5 depicts one embodiment of etching the dielectric layer 16, in which a first portion of the dielectric layer 16 remains atop a first portion of the metal containing layer 15 and a second portion of the dielectric layer 16 is removed to expose an underlying second portion of the metal containing layer 15. The second portion of the dielectric layer 16 may be removed from the p-type device regions 20 utilizing lithography and etching. For example, the lithographic step may include applying a photoresist to the dielectric layer 16, exposing the photoresist to a pattern of radiation and developing the pattern into the exposed photoresist utilizing a resist developer to provide a first etch mask. The first etch mask may be a patterned photoresist present overlying the first portion of the dielectric layer 16 that is atop the first portion of the metal containing layer 15, wherein the second portion of the dielectric layer 16 atop the second portion of the metal containing layer 15 is exposed. It is noted that although the above-described embodiment utilizes a patterned photoresist for the first etch mask, in other embodiments, a hardmask material, such as a dielectric, may be substituted for the photoresist used to provide the first etch mask.

Still referring to FIG. 5, the second portion of the dielectric layer 16, i.e., the portion of the dielectric layer 16 overlying the second portion of the metal containing layer 15, may be removed using a etching process, such as a selective etching process. As used herein, the term "selective" in reference to a material removal process denotes that the rate of material removal for a first material is greater than the rate of removal for at least another material of the structure to which the material removal process is being applied. In one embodiment, the etching process includes, but is not limited to chemical reactive ion etching (RIE), plasma etching, ion beam etching or laser ablation. In another embodiment, a wet etch, such as dilute HF or buffered HF, may be utilized to remove the exposed portion of the dielectric layer 16. Following etching, the first etch mask is typically removed from the structure utilizing a resist stripping process, such as oxygen ashing. In another embodiment, a wet resist strip using a mixture of sulfuric acid and peroxide may be employed.

Figure 6:
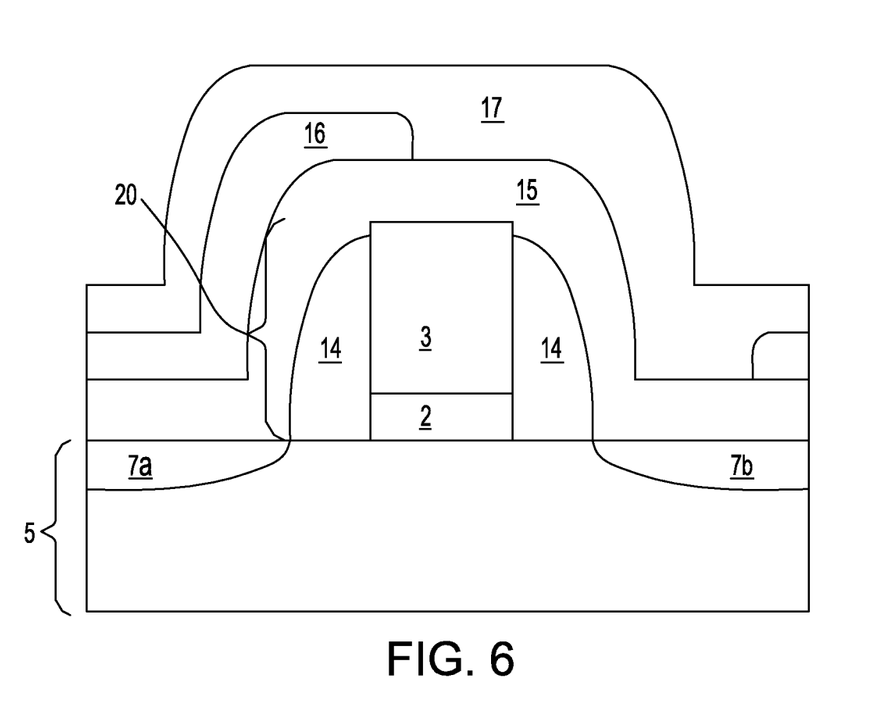
FIG. 6 is a side cross-sectional view depicting forming a semiconductor containing layer on at least the exposed portion of the metal layer, in accordance with one embodiment of the present method of forming an electrical device.

FIG. 6 depicts forming a semiconductor containing layer 17 on at least the exposed portion of the metal containing layer 15. In one embodiment, the semiconductor containing layer 17 is blanket deposited atop the structure depicted in FIG. 5. In one embodiment, the deposition process produces a conformal layer. The semiconductor containing layer 17 may be in direct contact with the remaining portion of the dielectric layer 16 and the exposed portion of the metal containing layer 15.

The semiconductor containing layer 17 may be a silicon-containing material. Si-containing materials include, but are not limited to: silicon, germanium, single crystal silicon, polycrystalline silicon, silicon germanium, silicon carbon alloy, silicon-on-silicon germanium, amorphous silicon, silicon-on-insulator (SOI), silicon germanium-on-insulator (SGOI), and annealed polysilicon. In one embodiment, the semiconductor containing layer 17 is composed of amorphous Si or polycrystalline Si. The semiconductor layer may be formed using a deposition method, such as chemical vapor deposition (CVD). Variations of CVD processes suitable for depositing the semiconductor containing layer 17 include, but are not limited to Atmospheric Pressure CVD (APCVD), Low Pressure CVD (LPCVD) and Plasma Enhanced CVD (EPCVDPECVD), Metal-Organic CVD (MOCVD) and combinations thereof. The thickness of the semiconductor containing layer 17 deposited at this point of the present method may vary, but typically the deposited semiconductor containing layer 17 has a thickness of from 5 nm to 100 nm. In another embodiment, the semiconductor containing layer 17 has a thickness ranging from 10 nm to 50 nm.

Figure 7:
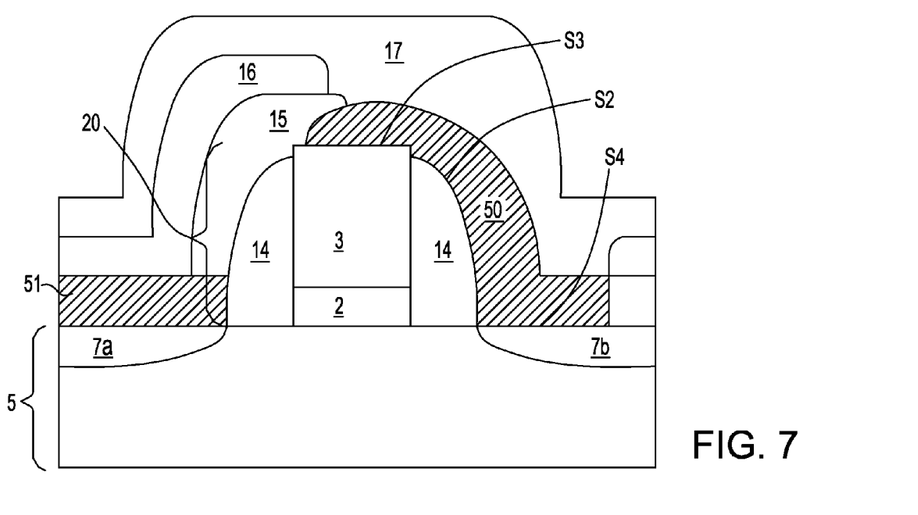
FIG. 7 is a side cross-sectional view depicting alloying the semiconductor containing layer and the second portion of the metal to provide a metal semiconductor alloy, in accordance with one embodiment of the present method of forming an electrical device.

FIG. 7 depicts alloying the semiconductor containing layer 17 and the second portion of the metal containing layer 15 that are in direct contact to provide a metal semiconductor alloy 50. In one embodiment, the metal semiconductor alloy 50 extends from at least the portion of the upper surface of the gate conductor 3 to at least the portion of the one of the source region 7a and the drain region 7b. The metal semiconductor alloy 50 does not extend from the gate conductor 3 to the other of the source region 7a and the drain region 7b. FIG. 7 depicts that the metal semiconductor alloy 50 continuously extends from the upper surface of the gate conductor 3 to the drain region 7b of the substrate, and does not extend to the source region 7a. Although not depicted in FIG. 7, embodiments have been contemplated in which the metal semiconductor alloy 50 extends from the upper surface of the gate conductor 3 to the source region 7a of the substrate 5, but does not extend to the drain region 7b of the substrate 5.

The metal semiconductor alloy 50 extends over an outer sidewall surface S2 of the at least one spacer 14. In one embodiment, the metal semiconductor alloy 50 is in direct contact with the outer sidewall surface S2 of the spacer 14, the upper surface S3 of the gate conductor 3 and the upper surface S4 of the drain region 7b, in which the metal semiconductor alloy 50 is not in contact with the source region 7a. In another embodiment, the metal semiconductor alloy 50 is in direct contact with the outersidewall surface S2 of the spacer 14, the upper surface S3 of the gate conductor 3 and the upper surface of the source region 7a (not shown in FIG. 7), in which the metal semiconductor alloy 50 is not in contact with the drain region 7b (not shown in FIG. 7).

In one embodiment, alloying of the metal containing layer 15 and the semiconductor containing layer 17 is provided by an annealing step. In one embodiment, annealing causes the metal of the metal containing layer 15 to react with the semiconductor containing layer 17 to provide a metal semiconductor alloy 50. In one embodiment, in which the semiconductor containing layer 17 is composed of silicon-containing material, such as polysilicon, the metal semiconductor alloy 50 is a silicide. Annealing may be provided by thermal anneal, rapid thermal anneal, laser anneal or combinations thereof. In one embodiment, annealing is at a temperature ranging from 150° C. to 700° C. In another embodiment, annealing is at a temperature ranging from 250° C. to 600° C.

In some embodiments, an alloyed region 51 composed of metal from the metal containing layer 15 and the semiconductor material of the substrate 5 is formed on the source region 7a or drain region 7b that is not in contact with the metal semiconductor alloy 50. In the embodiment that is depicted in FIG. 7, the alloyed region 51 is formed on the upper surface 7a of the substrate 5.

The semiconductor containing layer 17 that is not converted to the alloyed region 51 is removed by a selective etch process. More specifically, the semiconductor containing layer 17 that is not converted to the alloyed region 51 is removed by an etch that is selective to the dielectric layer 16 and the metal containing layer 15. The portion of the metal containing layer 15 that is not converted into the alloyed region 51 is removed by an etch process that is selective to the alloyed region 51.

Figure 8:
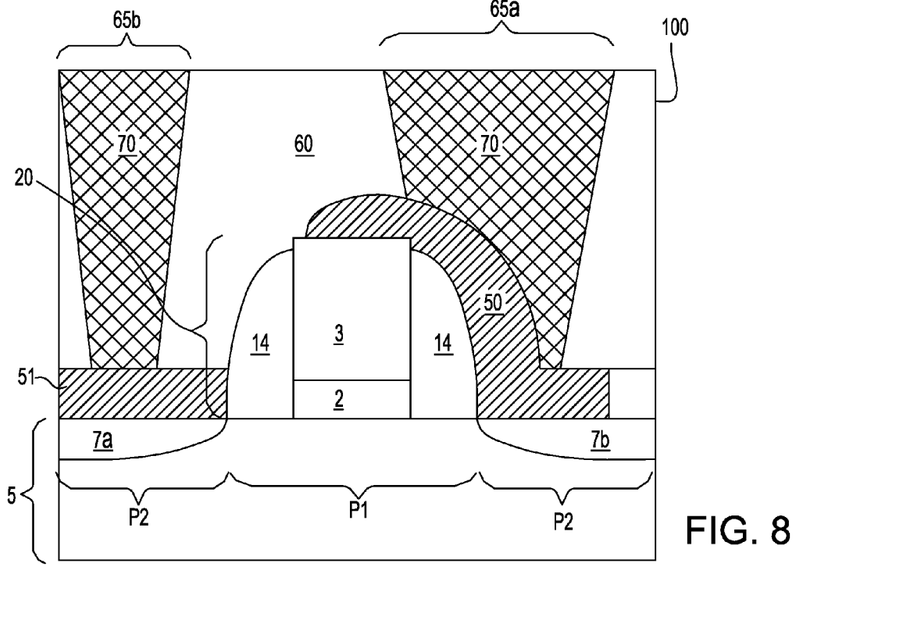
FIG. 8 is a side cross-sectional view depicting forming an interlevel dielectric having an interconnect present in a via to at least a portion of the metal semiconductor alloy, in accordance with one embodiment of the present method of forming an electrical device.

FIG. 8 depicts one embodiment of forming an interlevel dielectric 60 having an interconnect 70 present in a via 65 to at least a portion of the metal semiconductor alloy 50. In one embodiment, following formation of the metal semiconductor alloy region 35, a dielectric material can be blanket deposited atop the entire substrate and planarized to provide the interlevel dielectric 60. The blanket dielectric may be selected from the group consisting of silicon-containing materials, such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer 60 include: any of the aforementioned materials in porous form, or in a form that changes during processing to or from being porous and/or permeable to being non-porous and/or non-permeable.

In one embodiment, the interlevel dielectric 60 is patterned and etched to form a first via 65a to the metal semiconductor alloy 50 that extends from the upper surface of the gate conductor 3 over the outer sidewall S2 of the spacer 14 into electrical communication with one of the source region 7a and the drain region 7b. A second via 65b is formed to expose the alloyed region 51 that in present on an upper surface of the other of the source region 7a and the drain region 7b, which is not in contact with the metal semiconductor alloy 50. FIG. 8 depicts that the metal semiconductor alloy 50 is in contact with the drain region 7b and the alloyed region 51 in contact with the source region 7a, but embodiments have been contemplated in which the metal semiconductor alloy 50 is in contact with the source region 7a and the alloyed region 51 is in contact with the drain region 7b.

The first and second via 65a, 65b may be formed using deposition, photolithography and etch processes. In one embodiment, a second etch mask may be patterned to expose the portions of the interlevel dielectric 60 that are overlying the metal semiconductor alloy 50 and the alloyed region 51. The second etch mask (not shown) may comprise soft and/or hardmask materials and can be formed using deposition, photolithography and etching. In one embodiment, the second etch mask comprises a photoresist. A photoresist second etch mask can be produced by applying a photoresist layer to the surface of the interlevel dielectric 60, exposing the photoresist layer to a pattern of radiation, and then developing the pattern into the photoresist layer utilizing a resist developer.

In one embodiment, using the second etch mask, a selective etch process forms the first and second via 65a, 65b stopping on the metal semiconductor alloy 50 and the alloyed region 51. The term "selective" in reference to a material removal process denotes that the rate of material removal for a first material, e.g., interlevel dielectric 60, is greater than the rate of removal for at least another material, e.g., metal semiconductor alloy 50 and alloyed region 51, of the structure to which the material removal process is being applied. In one embodiment, the etch chemistry for removing the interlevel dielectric 60 selective to the metal semiconductor alloy 50 and the alloyed region 51 ranges from 10:1 to 200:1. In another embodiment, the etch chemistry for removing the interlevel dielectric 60 selective to the metal semiconductor alloy 50 and the alloyed region 51 ranges from 50:1 to 150:1. In yet another embodiment, the etch chemistry for removing the interlevel dielectric 60 selective to the metal semiconductor alloy 50 and the alloyed region 51 ranges from 75:1 to 100:1. In one embodiment, the etch chemistry for etching the interlevel dielectric layer selective to the metal semiconductor alloy includes $H_2$, $CH_2F_2$, $CF_4$, $C_4F_6$, $C_5F_8$ and Ar. The etch process may further employ end point detection methods.

In one embodiment, the etching process includes, but is not limited to chemical reactive ion etching (RIE), plasma etching, ion beam etching or laser ablation. In another embodiment, a wet etch, such as dilute HF, buffered HF and/or phosphoric acid ($H_3PO_4$) solutions, may be utilized to remove the exposed portion of the interlevel dielectric 60.

The etch process may be an anisotropic etch process or an isotropic etch process. One example of an anisotropic etch process is reactive ion etching (RIE). Reactive Ion Etching (RIE) is a form of plasma etching in which during etching, the surface to be etched is placed on an RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the disclosure include ion beam etching, plasma etching or laser ablation. Isotropic etching may be achieved using a wet chemical etch.

Following via formation, interconnects 70 are formed by depositing a conductive metal into the via holes 65a, 65b using deposition methods, such as CVD or plating. The conductive metal may include, but is not limited to tungsten, copper, aluminum, silver, gold and alloys thereof.

FIG. 8 depicts one embodiment of a transistor of a semiconductor device 100 in accordance with the present method. In one embodiment, the semiconductor device 100 includes a gate structure 20 present on a first portion P1 of a substrate 5, in which the gate structure 20 includes at least a gate conductor 3 and a at least one spacer 14 that is present in direct contact with a sidewall S1 of the gate conductor 3. Source and drain regions 7a, 7b are present in a second portion P2 of the substrate that is laterally adjacent to the first portion P1 of the substrate 5. A metal semiconductor alloy 50 is present on an upper surface of the gate conductor 3, present on an outer sidewall surface S2 of the at least one spacer 14, and present on an upper surface of one of the source and drain region 7a, 7b. An interlevel dielectric 60 is present having an interconnect 70 in electrical communication to the metal semiconductor alloy 50. The channel portion of the semiconductor device 100 is in the first portion P1 of the substrate 5, which is present between the source and drain region 7a, 7b. The gate dielectric 2, the gate conductor 3 and the at least one spacer 14 are present over the first portion P1 of the substrate, in which the channel is present. The metal semiconductor alloy 50 is present overlying the at least one spacer 14.

Therefore, the metal semiconductor alloy 50 protects the spacer 14 from being etched during the formation of the first via 65a in the interlevel dielectric 60 for the interconnect 70 to at least one of the source region 7a, drain region 7b and the gate conductor 3. In prior structures, in which the metal semiconductor alloy 50 is not present, etching vias in the interlevel dielectric etches the spacer that abuts the gate conductor to expose a portion of the channel, wherein the subsequently formed interconnect to the source and/or drain region contacts the channel and shorts the device. In one embodiment, the metal semiconductor alloy 50 of the present method eliminates the likelihood of etching the spacer in a manner that results in an interconnect contacting the channel and shorting the semiconductor device 100.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a device comprising:
   forming a gate structure on a substrate, wherein the gate structure includes a spacer on a sidewall of at least a gate conductor of the gate structure;
   forming a source region and a drain region in the substrate;
   forming a metal containing layer on at least an upper surface of the gate conductor of the gate structure, the spacer, and an upper surface of one of the source region and the drain region;
   forming a dielectric layer over a first portion of the metal containing layer, wherein a second portion of the metal containing layer extending from at least a portion of the upper surface of the gate conductor to at least a portion of the one of the source region and the drain region is exposed;
   forming a semiconductor containing layer on the second portion of the metal layer and the dielectric layer;
   alloying the semiconductor containing layer and the second portion of the metal to provide a metal semiconductor alloy extending from said at least the portion of the upper surface of the gate conductor to said at least the portion of the one of the source region and the drain region, wherein the metal semiconductor alloy extends over an outer sidewall of the spacer; and forming an interlevel dielectric having an interconnect present in a via to at least a portion of the metal semiconductor alloy.

2. The method of claim 1, wherein forming the gate structure comprises:
depositing at least one first gate dielectric atop the substrate;
depositing the gate conductor atop said at least one first gate dielectric;
forming an etch mask atop the gate conductor;
etching the gate conductor layer and said at least one gate dielectric selective to the etch mask to form a gate stack; and
forming the spacer on sidewalls of the gate stack.

3. The method of claim 2, wherein forming the spacers comprises depositing a spacer dielectric layer over the gate stack and anisotropically etching the spacer dielectric layer, wherein a remaining portion of the spacer dielectric layer is present on at least the sidewall of the gate conductor and a sidewall of the at least one gate dielectric.

4. The method of claim 3, wherein the forming of the source region and the drain regions in the substrate comprises ion implantation of an n-type or p-type dopant into a portion of the substrate that is adjacent to a portion of the substrate that is underlying the gate structure.

5. The method of claim 1, wherein forming the metal containing layer comprises physical vapor deposition.

6. The method of claim 1, wherein the metal containing layer comprises W, WN, Ta, TaN, Ti, TiN Al, Pt, Au, Ag, Cu, or a combination thereof.

7. The method of claim 1, wherein forming the dielectric layer comprises a growth process or chemical vapor deposition and an etch process.

8. The method of claim 7, wherein the etch process for forming the dielectric layer comprises forming a photoresist etch mask overlying the first portion of the dielectric layer and exposing the second portion of the dielectric layer, and etching the second portion of the dielectric layer using an anisotropic etch that is selective to the metal containing layer.

9. The method of claim 7, wherein the growth process for the forming of the dielectric layer comprises thermal oxidation.

10. The method of claim 1, wherein the forming of the semiconductor containing layer comprises chemical vapor deposition of a silicon containing material.

11. The method of claim 1, wherein the alloying of the semiconductor containing layer and the metal containing layer to provide the metal semiconductor alloy comprises annealing.

12. The method of claim 1, wherein the forming of the interlevel dielectric having the interconnect present in the via to said at least the portion of the metal semiconductor alloy comprises:

depositing an interlevel dielectric layer;
planarizing an upper surface of the interlevel dielectric layer;
patterng a photoresist layer to provide a via etch mask;
etching the interlevel dielectric layer selective to the via etch mask and the metal semiconductor alloy to provide a via through the interlevel dielectric layer exposing a portion of the metal semiconductor alloy; and
depositing a conductive material within the via to provide the interconnect.

13. A method of forming a device comprising:
forming a gate structure on a substrate, wherein a spacer is present in direct contact with a sidewall of the gate structure;
forming a source region and a drain region in the substrate;
forming a metal semiconductor alloy on an upper surface of the gate structure, an outer sidewall of the spacer and an upper surface of one of the source region and the drain region, wherein the forming of the metal semiconductor alloy comprises forming a metal containing layer on the upper surface of the gate structure, the spacer, and an upper surface of the source region and the drain region, forming a dielectric layer over a first portion of the metal containing layer, wherein a second portion of the metal containing layer extending from at least a portion of the upper surface of the gate structure to at least a portion of one of the source region and the drain region, forming a semiconductor containing layer on the second portion of the metal layer and the dielectric layer, and alloying the semiconductor containing layer and the second portion of the metal containing layer to provide the metal semiconductor alloy;
forming an interlevel dielectric over the metal semiconductor alloy;
forming a via through the interlevel dielectric stopping on the metal semiconductor alloy; and
forming an interconnect to the metal semiconductor alloy in the via.

14. The method of claim 13, wherein forming the interlevel dielectric comprises depositing a dielectric layer overlying the gate structure and the source region and the drain region that is present in the substrate, and planarizing an upper surface of the interlevel dielectric.

15. The method of claim 13, wherein the forming of the via through the interlevel dielectric comprises forming an etch mask on an upper surface of the interlevel dielectric, and etching the interlevel dielectric selective to the metal semiconductor alloy.

* * * * *